(12) United States Patent
Lee et al.

(10) Patent No.: US 6,655,917 B1
(45) Date of Patent: Dec. 2, 2003

(54) METHOD AND APPARATUS FOR SERIAL COOLANT FLOW CONTROL

(75) Inventors: Mario J. Lee, Santa Clara, CA (US); Anthony N. Eberhardt, Los Gatos, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/691,483

(22) Filed: Oct. 17, 2000

(51) Int. Cl.[7] ................................................. H05K 7/20
(52) U.S. Cl. ........................................ 416/128; 361/695
(58) Field of Search ........................ 454/184; 361/695; 416/128

(56) References Cited

U.S. PATENT DOCUMENTS

| | | | | |
|---|---|---|---|---|
| 1,316,139 A | * | 9/1919 | Cake | |
| 1,365,871 A | * | 1/1921 | Thiesen | |
| 3,574,477 A | * | 4/1971 | Dolf | 415/119 |
| 3,811,791 A | * | 5/1974 | Cotton | |
| 3,873,229 A | * | 3/1975 | Mikolajczak et al. | 415/119 |
| 5,572,403 A | * | 11/1996 | Mills | 361/695 |
| 5,931,640 A | * | 8/1999 | Van Houten et al. | 416/128 |
| 6,333,851 B1 | * | 12/2001 | Shih | 361/695 |

* cited by examiner

*Primary Examiner*—Harold Joyce
(74) *Attorney, Agent, or Firm*—O'Melveny & Myers LLP

(57) ABSTRACT

The present invention provides a method and apparatus for serial coolant flow control. In one embodiment of the present invention, two or more sets of angled rotating blades are used in series to increase the coolant pressure and flow. In this embodiment, the rotational direction of a set of blades is the reverse of the rotational direction of any set of blades next to it. In one embodiment, the angles of the blades are such that the forward velocity created by a set of blades is in the same direction as forward velocities created by other sets of blades in the system. In one embodiment, the blades of one set form a right angle with the blades of any set next to it. In one embodiment, the coolant flow controller is a fan. In another embodiment, the coolant is air. In yet another embodiment, the system being cooled is an electronic system.

14 Claims, 7 Drawing Sheets

Figure 1: Negatively Pressured Cooling System

Figure 2: Coolant Flow Caused by Angled Rotating Blades

Figure 3: Coolant Flow Caused by a Sequence of Two Identical Sets of Angled Rotating Blades Figure 4: Coolant Flow Controller

Figure 5: Coolant Flow

Figure 6: Cooling an Electronic System

METHOD AND APPARATUS FOR SERIAL COOLANT FLOW CONTROL

BACKGROUND OF THE INVENTION

1. Field of the Invention

The present invention relates to the field of cooling systems, and in particular to a method and apparatus for serial coolant flow control.

Sun, Sun Microsystems, the Sun logo, Solaris and all Java-based trademarks and logos are trademarks or registered trademarks of Sun Microsystems, Inc. in the United States and other countries. All SPARC trademarks are used under license and are trademarks of SPARC International, Inc. in the United States and other countries. Products bearing SPARC trademarks are based upon an architecture developed by Sun Microsystems, Inc.

2. Background Art

Many systems require cooling to function properly. Some systems accomplish cooling through the flow of a coolant through the system. In many cooling systems, it is desirable to increase the amount of coolant flowing through the system. However, current schemes to increase coolant flow involve unacceptably increasing the size of coolant flow control units. This problem can be better understood by a review of cooling systems.

Cooling Systems

Many systems (e.g. general purpose computers, automobiles and nuclear reactors) use a coolant to cool the system. Coolants can be any of a variety of substances, including light water, heavy water, air, carbon dioxide, helium, liquid sodium, liquid sodium-potassium alloy, and hydrocarbons (oils). Such substances are good conductors of heat and serve to carry the thermal energy produced by the system away from the system. A system draws fresh coolant in through one or more coolant intakes. The coolant, then, passes over system components which require cooling. Heat transfers from the system components to the coolant, thus cooling the components. Then, the heated coolant is expelled through one or more coolant exhausts.

Pressurized Cooling Systems

The flow of coolant is often driven by a pressure difference between the interior and exterior of the system. The pressure difference is created by a coolant flow control unit. In a negatively pressurized system, a coolant flow control unit forces coolant out through a coolant exhaust. The smaller amount of coolant in the system causes the pressure inside the system to drop. Thus, the pressure inside the system will drop below the pressure outside the system near one or more coolant intakes. The pressure difference forces fresh coolant into the system through one or more coolant intakes. The coolant intakes and exhausts are positioned so that coolant flows through the parts of the system which require cooling. Heat transfers from the system parts to the coolant, and the coolant carries the heat out of the system.

Similarly, in a positively pressurized system, a coolant flow control unit forces coolant in through a coolant intake. The larger amount of coolant in the system causes the pressure inside the system to increase. Thus, the pressure inside the system will rise above the pressure outside the system near one or more coolant exhausts. The pressure difference forces heated coolant out of the system through one or more coolant exhausts. The coolant intakes and exhausts are positioned so that coolant flows through the parts of the system which require cooling. Heat transfers from the system parts to the coolant, and the coolant carries the heat out of the system.

FIG. 1 illustrates a system which cools through a negatively pressurized cooling system. The coolant flow control unit (100) causes the pressure on the inside of the system (110) near the coolant exhaust (120) to be higher than the pressure on the outside of the system (130). As a result, heated coolant (140) is expelled from the system through the coolant exhaust. The decrease in the amount of coolant in the system causes the pressure inside the system near the coolant intake (150) to be lower than the pressure outside the system. Thus, fresh coolant (160) flows into the system through the coolant intake. The fresh coolant will flow from the coolant intake, over the vital system components (170) and to the coolant exhaust.

Coolant Flow Controller

Coolant flow controllers drive the flow of coolant through a system. Controllers commonly utilize angled rotating blades. For example, a common household fan is a set of angled rotating blades which forces coolant (air) to flow in the system. As the blades pass through the coolant, coolant is pushed towards the trailing edge of the blade. Thus, the angled rotating blades created a flow of coolant. The rate the coolant flows tangential to the direction of the blade is termed "forward velocity." The rate the coolant flows in the direction opposite the direction of the blade rotation is termed "swirl velocity."

FIG. 2 illustrates coolant flow caused by angled rotating blades. Blades 1 (200), 2 (205) and 3 (210) rotate in the direction indicated by arrow 1 (215). Arrows 2 (220), 3 (225) and 4 (230) represent the flow of coolant caused by the angled rotating blades. The flow of coolant is the combination of a forward velocity (235) and a swirl velocity (240).

One common desire in coolant flow controller design is to increase the pressure and flow generated by the controller. The addition of another set of identical rotating blades is a method which fails to generate greater pressure or flow., Since the coolant is already flowing at the same angle of the second rotating blade, the second rotating blade is unable to transfer additional energy to the flowing coolant. Thus, a sequence of sets of identical angled rotating blades fails to increase pressure or flow.

FIG. 3 illustrates coolant flow caused by a sequence of two identical sets of angled rotating blades. Blades 1 (300), 2 (305) and 3 (310) rotate in the direction indicated by arrow 1 (315). Blades 4 (320), 5 (325) and 6 (330) rotate in the direction indicated by arrow 2 (335). Arrows 3 (340), 4 (345) and 5 (350) represent the magnitude and direction of the flow of coolant caused by blades 1, 2 and 3. Arrows 6 (355), 7 (360) and 8 (365) represent the magnitude and direction of the flow of coolant caused by blades 4, 5 and 6. Because the sets of rotating blades are identical, the magnitude and direction of flow caused by blades 1, 2 and 3 are equal to the magnitude and direction of flow caused by blades 4, 5 and 6. Thus, the second set of blades does not increase the pressure or flow.

One prior art method for increasing pressure and flow involves increasing-the size of the rotating blades. However, for applications where size is limited, this method is not appropriate. Another prior art method for increasing pressure and flow involves increasing the speed at which the blades rotate. However, physical constraints limit the speed at which a set of blades rotate. Once this maximum speed is reached, this method fails to produce further increases in pressure and flow.

SUMMARY OF THE INVENTION

The present invention provides a method and apparatus for serial coolant flow control. In one embodiment of the present invention, two or more sets of angled rotating blades are used in series to increase the coolant pressure and flow. In this embodiment, the rotational direction of a set of blades is the reverse of the rotational direction of any set of blades next to it.

In one embodiment, the angles of the blades are such that the forward velocity created by a set of blades is in the same direction as forward velocities created by other sets of blades in the system. In one embodiment, the blades of one set form a right angle with the blades of any set next to it.

In one embodiment, the coolant flow controller is a fan. In another embodiment, the coolant is air. In yet another embodiment, the system being cooled is an electronic system (e.g., a computer).

BRIEF DESCRIPTION OF THE DRAWINGS

These and other features, aspects and advantages of the present invention will become better understood with regard to the following description, appended claims and accompanying drawings where:

DETAILED DESCRIPTION OF THE INVENTION

The invention is a method and apparatus for serial coolant flow control. In the following description, numerous specific details are set forth to provide a more thorough description of embodiments of the invention. It is apparent, however, to one skilled in the art, that the invention may be practiced without these specific details. In other instances, well known features have not been described in detail so as not to obscure the invention.

In one embodiment of the present invention, two or more sets of angled rotating blades are used in series to increase the coolant pressure and flow. In this embodiment, the rotational direction of a set of blades is the reverse of the rotational direction of any set of blades next to it.

Figure 1:
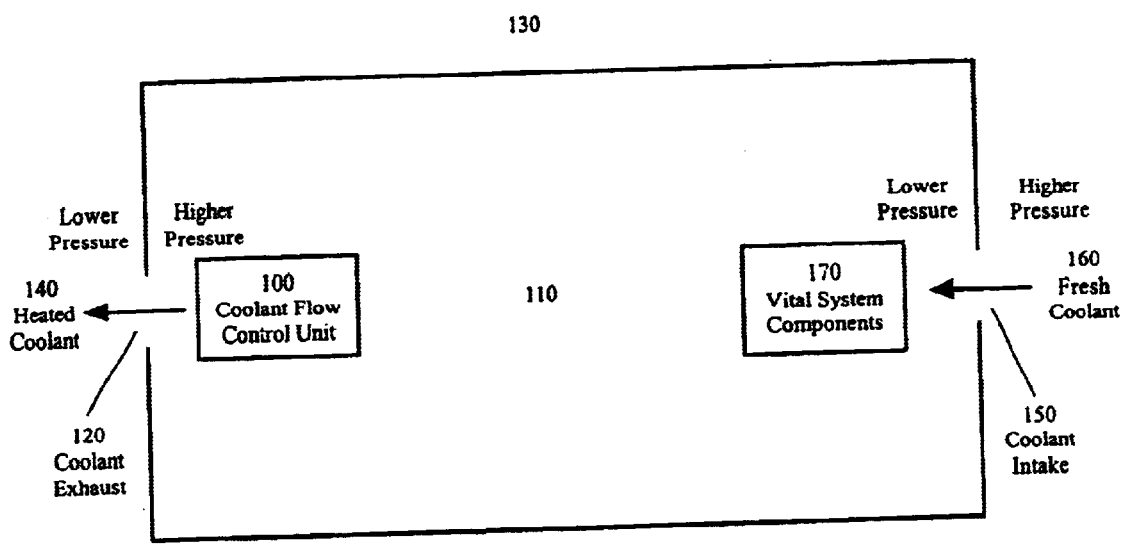
FIG. 1 is a block diagram of a system which cools through a negatively pressurized cooling system.
Figure 2:
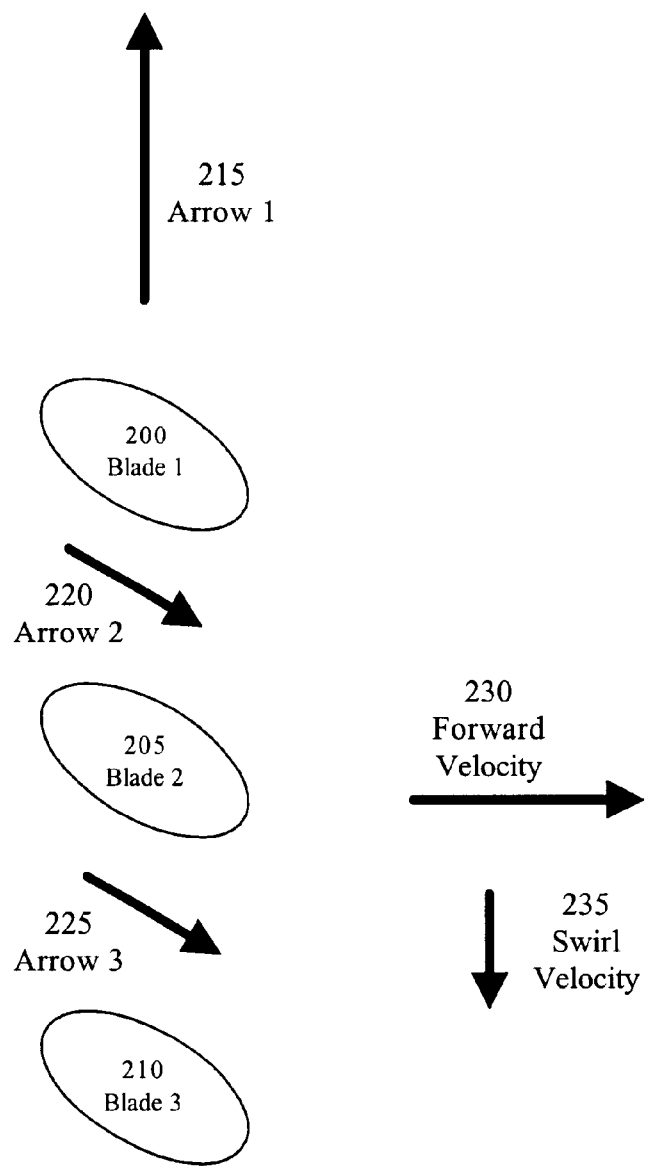
FIG. 2 is a block diagram of coolant flow caused by angled rotating blades.
Figure 3:
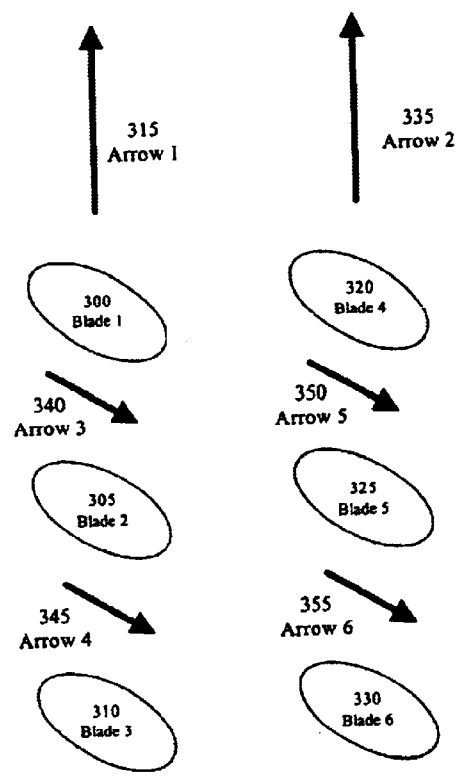
FIG. 3 is a block diagram of coolant flow caused by a sequence of two identical sets of angled rotating blades.
Figure 4:
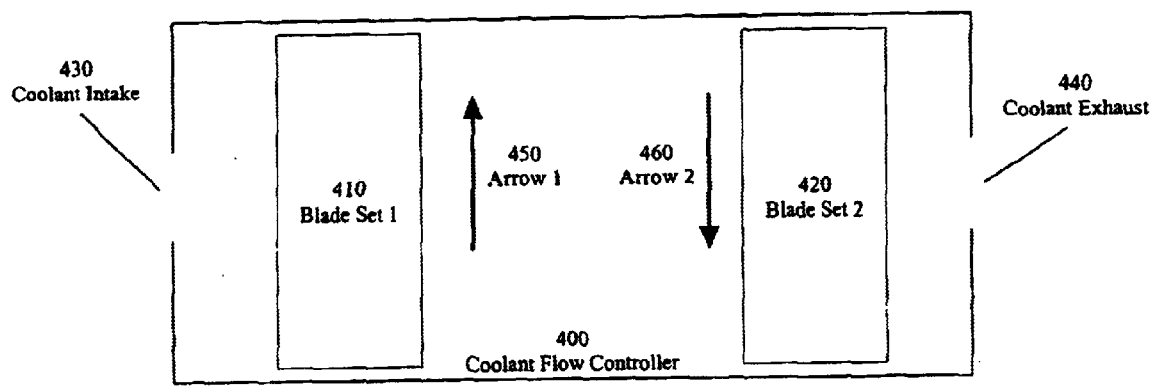
FIG. 4 is a block diagram of a coolant flow controller in accordance with one embodiment of the present invention.

FIG. 4 illustrates a coolant flow controller in accordance with one embodiment of the present invention. The coolant flow controller (400) comprises blade set 1 (410), blade set 2 (420), a coolant intake (430) and a coolant exhaust (440). Blade set 1 rotates in the direction of arrow 1 (450). Blade set 2 rotates in the direction of arrow 2 (460). Thus, coolant flows into the coolant flow controller through the coolant intake, through blade set 1, through blade set 2 and out of the coolant flow controller through the coolant exhaust.

In one embodiment, the angles of the blades are such that the forward velocity created by a set of blades is in the same direction as forward velocities created by other sets of blades in the system. In one embodiment, the blades of one set form a right angle with the blades of any set next to it.

Figure 5:
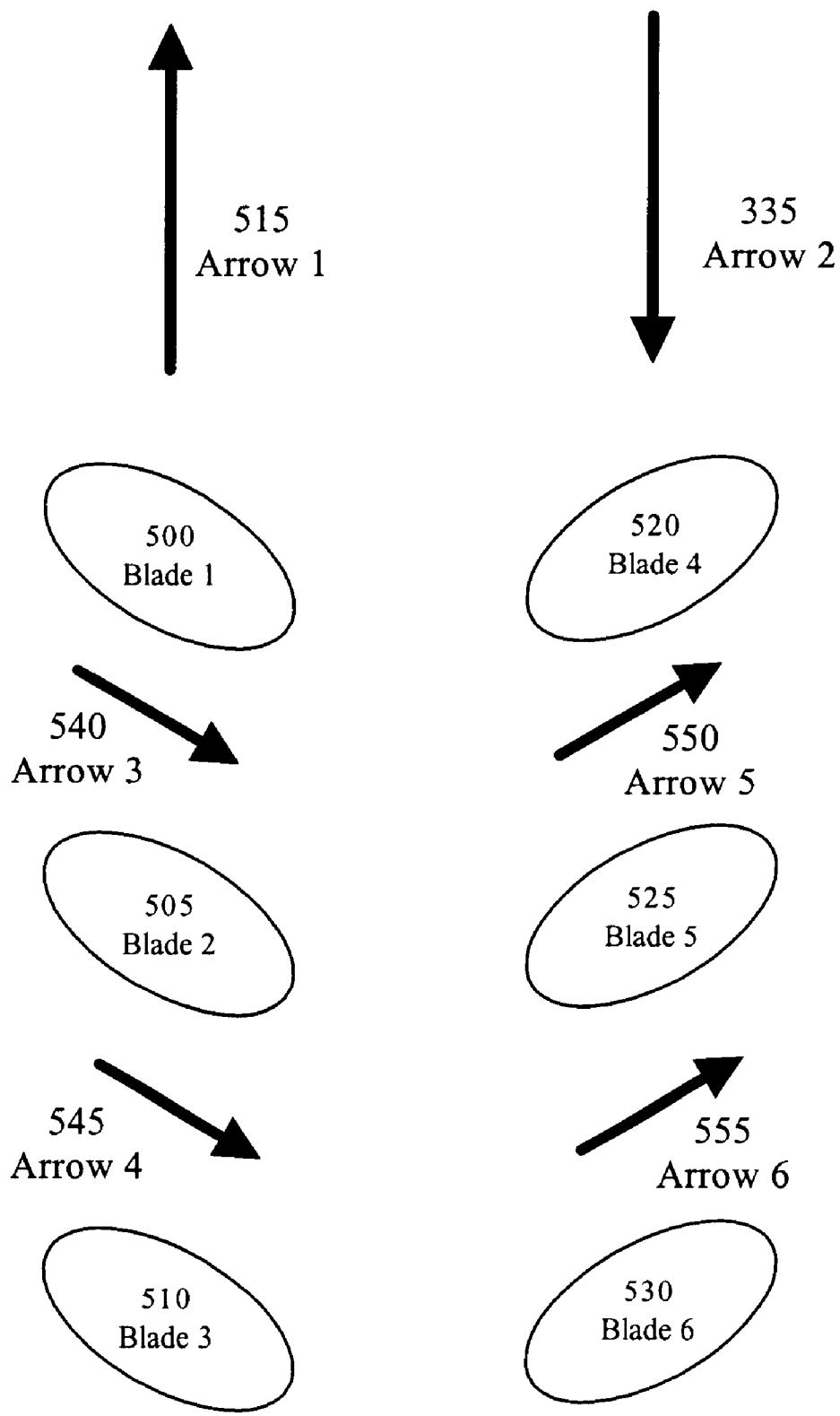
FIG. 5 is a block diagram of coolant flow in accordance with one embodiment of the present invention.

FIG. 5 illustrates coolant flow in accordance with one embodiment of the present invention. Blades 1 (500), 2 (505) and 3 (510) rotate in the direction indicated by arrow 1 (515). Blades 4 (520), 5 (525) and 6 (530) rotate in the direction indicated by arrow 2 (535). Arrows 3 (540), 4 (545) and 5 (550) represent the magnitude and direction of the flow of coolant caused by blades 1, 2 and 3. Arrows 6 (555), 7 (560) and 8 (565) represent the magnitude and direction of the flow of coolant caused by blades 4, 5 and 6. Blades 1, 2 and 3 are positioned at right angles to blades 4, 5 and 6. Additionally, blades 1, 2 and 3 rotate in the opposite direction as blades 4, 5 and 6. Thus, blades 4, 5 and 6 are able to transfer additional energy to the coolant. The additional energy results in increased coolant pressure and flow.

Comparable pressure and flow increases are achieved by prior art method as is accomplished by sequential counter-rotating angled blades. However, to achieve the same increase, sequential counter-rotating angled blades require less space than prior art methods.

One embodiment of the present invention uses air as a coolant. In this embodiment, the set of angled rotating blades are a fan. One embodiment is used to cool electronic systems such as computers.

Figure 6:
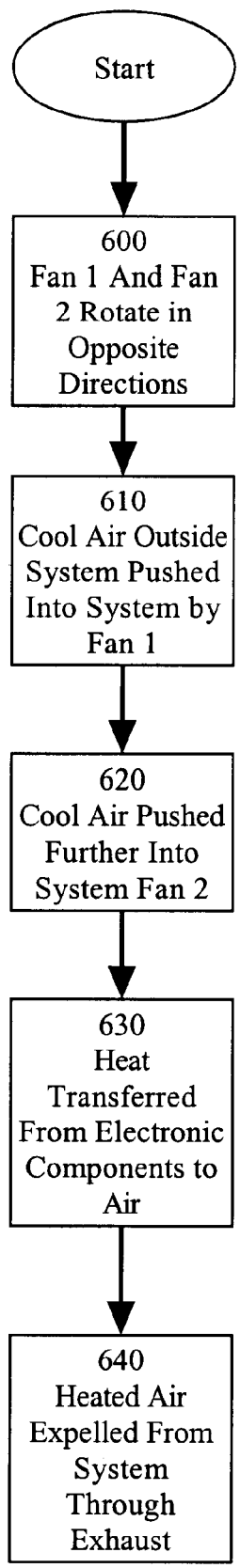
FIG. 6 is a flow diagram of the process of cooling an electronic system in accordance with one embodiment of the present invention.

FIG. 6 illustrates the process of cooling an electronic system in accordance with one embodiment of the present invention. At step 600, fan 1 and fan 2 begin rotating in opposite directions. At step 610, cool air outside the system is pushed into the system by fan 1. At step 620, the cool air is pushed further into the system by fan 2. At step 630, heat is transferred from the electronic components to the air. At step 640, the heated air is expelled from the system through an exhaust.

Embodiment of Computer Execution Environment (Hardware)

Figure 7:
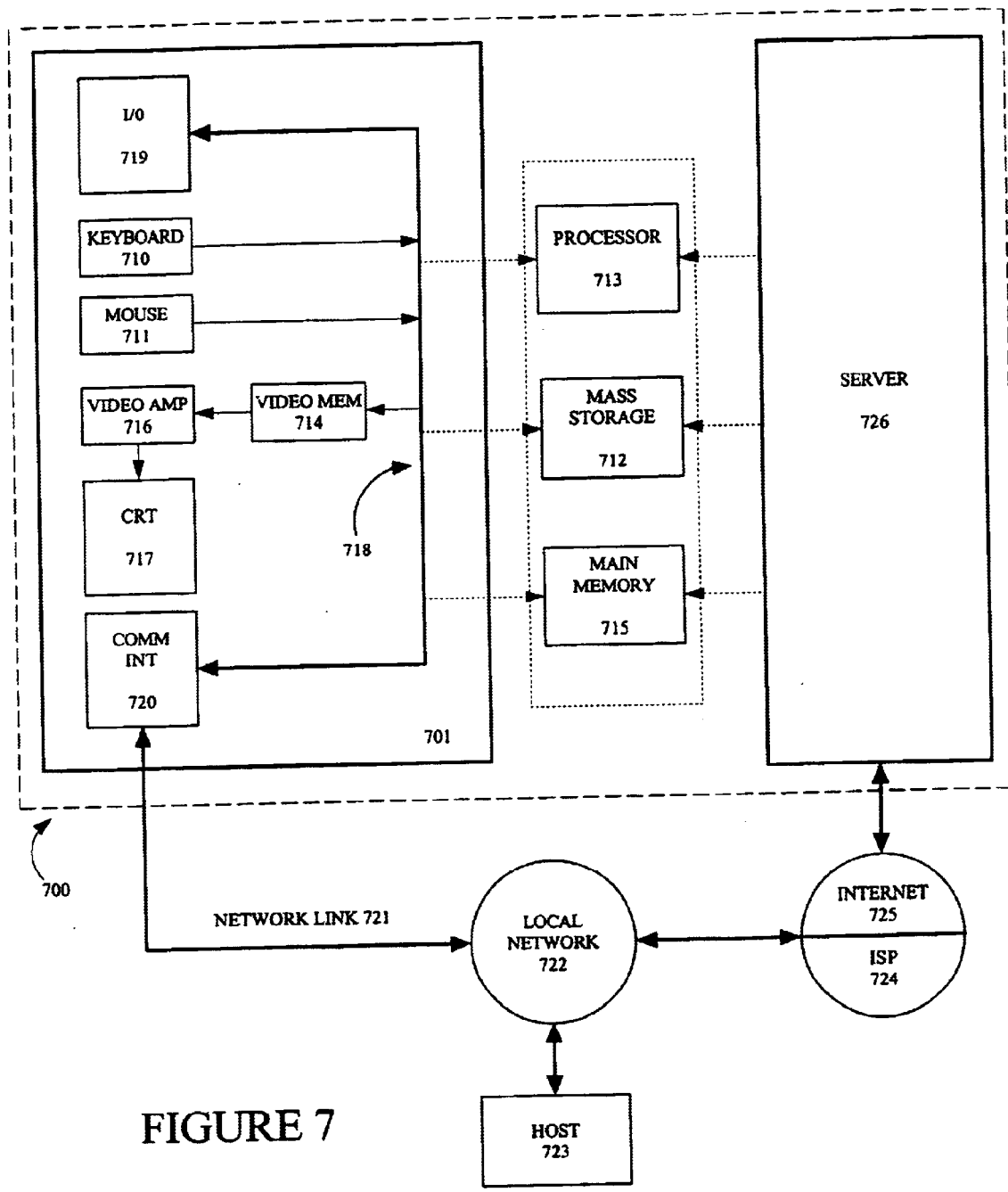
FIG. 7 is a block diagram of a general purpose computer.

An embodiment of the invention can be implemented as computer software in the form of computer readable program code executed in a general purpose computing environment such as environment 700 illustrated in FIG. 7, or in the form of bytecode class files executable within a Java™ run time environment running in such an environment, or in the form of bytecodes running on a processor (or devices enabled to process bytecodes) existing in a distributed environment (e.g., one or more processors on a network). A keyboard 710 and mouse 711 are coupled to a system bus 718. The keyboard and mouse are for introducing user input to the computer system and communicating that user input to central processing unit (CPU) 713. Other suitable input devices may be used in addition to, or in place of, the mouse 711 and keyboard 710. I/O (input/output) unit 719 coupled to bi-directional system bus 718 represents such I/O elements as a printer, A/V (audio/video) I/O, etc.

Computer 701 may include a communication interface 720 coupled to bus 718. Communication interface 720 provides a two-way data communication coupling via a network link 721 to a local network 722. For example, if communication interface 720 is an integrated services digital network (ISDN) card or a modem, communication interface 720 provides a data communication connection to the corresponding type of telephone line, which comprises part of network link 721. If communication interface 720 is a local area network (LAN) card, communication interface 720 provides a data communication connection via network link 721 to a compatible LAN. Wireless links are also possible. In any such implementation, communication interface 720 sends and receives electrical, electromagnetic or optical signals which carry digital data streams representing various types of information.

Network link 721 typically provides data communication through one or more networks to other data devices. For example, network link 721 may provide a connection through local network 722 to local server computer 723 or to data equipment operated by ISP 724. ISP 724 in turn provides data communication services through the world wide packet data communication network now commonly referred to as the "Internet" 725. Local network 722 and Internet 725 both use electrical, electromagnetic or optical signals which carry digital data streams. The signals through the various networks and the signals on network link 721 and through communication interface 720, which carry the digital data to and from computer 700, are exemplary forms of carrier waves transporting the information.

Processor 713 may reside wholly on client computer 701 or wholly on server 726 or processor 713 may have its computational power distributed between computer 701 and server 726. Server 726 symbolically is represented in FIG. 7 as one unit, but server 726 can also be distributed between multiple "tiers". In-one embodiment, server 726 comprises a middle and back tier where application logic executes in the middle tier and persistent data is obtained in the back tier. In the case where processor 713 resides wholly on server 726, the results of the computations performed by processor 713 are transmitted to computer 701 via Internet 725, Internet Service Provider (ISP) 724, local network 722 and communication interface 720. In this way, computer 701 is able to display the results of the computation to a user in the form of output.

Computer 701 includes a video memory 714, main memory 715 and mass storage 712, all coupled to bi-directional system bus 718 along with keyboard 710, mouse 711 and processor 713. As with processor 713, in various computing environments, main memory 715 and mass storage 712, can reside wholly on server 726 or computer 701, or they may be distributed between the two. Examples of systems where processor 713, main memory 715, and mass storage 712 are distributed between computer 701 and server 726 include the thin-client computing architecture developed by Sun Microsystems, Inc., the palm pilot computing device and other personal digital assistants, Internet ready cellular phones and other Internet computing devices, and in platform independent computing environments, such as those which utilize the Java technologies also developed by Sun Microsystems, Inc.

The mass storage 712 may include both fixed and removable media, such as magnetic, optical or magnetic optical storage systems or any other available mass storage technology. Bus 718 may contain, for example, thirty-two address lines for addressing video memory 714 or main memory 715. The system bus 718 also includes, for example, a 32-bit data bus for transferring data between and among the components, such as processor 713, main memory 715, video memory 714 and mass storage 712. Alternatively, multiplex data/address lines may be used instead of separate data and address lines.

In one embodiment of the invention, the processor 713 is a SPARC microprocessor from Sun Microsystems, Inc., a microprocessor manufactured by Motorola, such as the 680X0 processor, or a microprocessor manufactured by Intel, such as the 80X86 or Pentium processor. However, any other suitable microprocessor or microcomputer may be utilized. Main memory 715 is comprised of dynamic random access memory (DRAM). Video memory 714 is a dual-ported video random access memory. One port of the video memory 714 is coupled to video amplifier 716. The video amplifier 716 is used to drive the cathode ray tube (CRT) raster monitor 717. Video amplifier 716 is well known in the art and may be implemented by any suitable apparatus. This circuitry converts pixel data stored in video memory 714 to a raster signal suitable for use by monitor 717. Monitor 717 is a type of monitor suitable for displaying graphic images.

Computer 701 can send messages and receive data, including program code, through the network(s), network link 721, and communication interface 720. In the Internet example, remote server computer 726 might transmit a requested code for an application program through Internet 725, ISP 724, local network 722 and communication interface 720. The received code may be executed by processor 713 as it is received, and/or stored in mass storage 712, or other non-volatile storage for later execution. In this manner, computer 700 may obtain application code in the form of a carrier wave. Alternatively, remote server computer 726 may execute applications using processor 713, and utilize mass storage 712, and/or video memory 715. The results of the execution at server 726 are then transmitted through Internet 725, ISP 724, local network 722 and communication interface 720. In this example, computer 701 performs only input and output functions.

Application code may be embodied in any form of computer program product. A computer program product comprises a medium configured to store or transport computer readable code, or in which computer readable code may be embedded. Some examples of computer program products are CD-ROM disks, ROM cards, floppy disks, magnetic tapes, computer hard drives, servers on a network, and carrier waves.

An exemplary embodiment of the invention may be implemented as a computer program product embodied as a computer usable medium having a computer readable program code embodied therein that is configured to provide serial coolant flow control. The coolant may be air, for example, or any other suitable coolant. The coolant flow control may be used in an electronic system, for example, or any other system that requires cooling. In this exemplary embodiment, the computer program product includes computer readable code that is configured to cause a computer to rotate a first set of blades in a first rotational direction. The blades in this first set are configured at a first angle to a rotational axis such that the first set of blades may propel a coolant in a forward direction along the rotational axis and a first swirl direction tangential to the rotational axis. In this exemplary embodiment, the computer program product also has computer readable code that is configured to cause a computer to rotate a second set of blades in a second rotational direction. The blades of this second set are configured at a second angle to the rotational axis such that the second set of blades propel the coolant in the forward direction along the rotational axis and a second swirl direction tangential to the rotational axis. In this exemplary embodiment, the first set of blades is in series with the second set of blades.

In an alternate exemplary embodiment, the computer readable code is configured to rotate the first set of blades in the opposite direction of the second set of blades. In another alternate exemplary embodiment, the first swirl direction is opposite of the second swirl direction. In an alternate exemplary embodiment, the first angle, e.g., the angle of the blades in the first set, is at a right angle to the second angle, e.g., the angle of the blades in the second set.

The computer systems described above are for purposes of example only. An embodiment of the invention may be implemented in any type of computer system or programming or processing environment.

Thus, a method and apparatus for serial coolant flow control is described in conjunction with one or more specific embodiments. The invention is defined by the following claims and their full scope an equivalents.

What is claimed is:

1. A method of cooling at least one electronic device located inside an enclosure comprising:

positioning a first plurality of blades configured at a first angle to a rotational axis substantially adjacent to a first opening in said enclosure;

positioning a second plurality of blades configured at a second angle to said rotational axis substantially adjacent to, and in series with, said first plurality of blades, wherein said first angle is different from said second angle; and rotating said first plurality of blades in a first rotational direction and said second set of blades in a second rotational direction to propel coolant through a second opening in said enclosure by creating a differential pressure between the inside of said enclosure and the outside of said enclosure, said coolant being used to cool said at least one electronic device.

2. The method of claim 1 wherein said first rotational direction is opposite of said second rotational direction.

3. The method of claim 1 wherein said first angle is at a right angle to said second angle.

4. The method of claim 1 wherein said coolant is air.

5. A system for cooling at least one electronic device comprising:

at least one electronic device;

an enclosure including an interior coolant region, an exterior coolant region, a coolant intake and a coolant exhaust, said at least one electronic device being located inside said enclosure and having at least one exterior surface exposed to said interior coolant region;

a coolant; and a serial coolant flow controller located inside said enclosure, said serial coolant flow controller comprising:

a first plurality of blades located substantially adjacent to said coolant intake and configured to rotate in a first rotational direction wherein said first plurality of blades are configured at a first angle to a rotational axis and are operable to propel at least a portion of said coolant into said enclosure via said coolant intake; and a second plurality of blades located substantially adjacent to, and in series with, said first plurality of blades and configured to rotate in a second rotational direction wherein said second plurality of blades are configured at a second angle to said rotational axis and are operable to propel said at least a portion of said coolant into said interior coolant region, said at least a portion of said coolant being propelled out of said enclosure via said coolant exhaust when the pressure of said interior coolant region exceeds the pressure of said exterior coolant region, wherein said first angle is different from said second angle.

6. The system of claim 5 wherein said first rotational direction is opposite of said second rotational direction.

7. The system of claim 5 wherein said first angle is at a right angle to said second angle.

8. The system of claim 5 wherein said coolant is air.

9. A computer program product comprising:

a computer usable medium having computer readable program code embodied therein configured for serial coolant flow control, comprising:

computer readable code configured to cause a computer to rotate a first plurality of blades in a first rotational direction wherein said first plurality of blades are configured at a first angle to a rotational axis wherein said first plurality of blades are operable to transfer a first amount of energy to the coolant to propel said coolant and provide a coolant pressure at a first pressure level and a coolant flow at a first coolant flow rate, and thereby propel a coolant in a forward direction along said rotational axis and a first swirl direction tangential to said rotational axis; and computer readable code configured to cause a computer to rotate a second plurality of blades in a second rotational direction wherein said second plurality of blades are configured at a second angle to said rotational axis wherein said second plurality of blades are operable to transfer a second amount of energy to said coolant to propel said coolant and increase said coolant pressure from said first pressure level to a second pressure level and increase said coolant flow from said first coolant flow rate to a second coolant flow rate, and thereby propel said coolant in said forward direction along said rotational axis and a second swirl direction tangential to said rotational axis wherein said first plurality of blades is in series with said second plurality of blades.

10. The computer program product of claim 9 wherein said first rotational direction is opposite of said second rotational direction.

11. The computer program product of claim 10 wherein said first swirl direction is opposite of said second swirl direction.

12. The computer program product of claim 11 wherein said first angle is at a right angle to said second angle.

13. The computer program product of claim 11 wherein said coolant is air.

14. The computer program of claim 11 wherein the computer program product is operable to cause the computer to propel said coolant to cool an electronic system.

* * * * *